United States Patent
Serquis et al.

(10) Patent No.: US 6,511,943 B1
(45) Date of Patent: Jan. 28, 2003

(54) SYNTHESIS OF MAGNESIUM DIBORIDE BY MAGNESIUM VAPOR INFILTRATION PROCESS (MVIP)

(75) Inventors: Adriana C. Serquis, Los Alamos, NM (US); Yuntian T. Zhu, Los Alamos, NM (US); Frederick M. Mueller, Los Alamos, NM (US); Dean E. Peterson, Los Alamos, NM (US); Xiao Zhou Liao, Los Alamos, NM (US)

(73) Assignee: The Regents of the University of California, Los Alamos, NM (US)

( * ) Notice: Subject to any disclaimer, the term of this patent is extended or adjusted under 35 U.S.C. 154(b) by 0 days.

(21) Appl. No.: 10/096,774

(22) Filed: Mar. 13, 2002

(51) Int. Cl.[7] .................. H01L 39/24; H01B 12/00; H01B 1/02; C22C 29/14
(52) U.S. Cl. .................. 505/300; 420/402; 420/901; 252/521.4; 423/289; 423/155; 505/100; 505/430; 505/490; 505/500; 505/736; 505/805
(58) Field of Search .................. 252/521.4; 423/289, 423/155; 420/402, 901; 505/100, 300, 430, 490, 500, 736, 805

(56) References Cited

FOREIGN PATENT DOCUMENTS

CA          CN 1329370        *  1/2002   .......... H01L/39/12

OTHER PUBLICATIONS

Nagamatsu et al, "Superconductivity at 39K in Magnesium Boride", Nature, 410, 63–64, 2001.*
Aswal et al, "Synthesis and Characterization of MgB2 Superconductor", J. Physica. C., 363, 149–154, (2001).*
Christen et al, "Superconducting magnesium diboride films with Tc=24K grown by pulsed laser deposition with in situ anneal", J. Physica. C. 353, 157–161, 2001.*
Eom et al, "High critical density and enhanced irreversibility field in superconducting MgB2 thin films", Nature, 411, 558–560, 2001.*
Cunningham et al, "Synthesis and processing of MgB2 powders and wires", J. Physica. C. 353, 5–10, 2001.*
Bud'ko et al, "Boron Isotope Effect in Superconducting MgB2", Phys. Rev. Lett. 86(9), 1877–1880, 2001.*
Aswal et al., "Synthesis and Characterization of $MgB_2$ Superconductor," Physica C 363, pp. 149–154, 2001.
Frederick et al., "Improved Superconducting Properties of $MgB_2$," Physica C 363, pp. 1–5, 2001.
Cunningham et al., "Synthesis and Processing of $MgB_2$ Powders and Wires," Physica C 353, pp. 5–10, 2001.
Bud'ko et al., "Boron Isotope Effect in Superconducting $MgB_2$," Physical Review Letters, vol. 86, No. 9, pp. 1877–1880, Feb. 2001.
Serquis et al., "Effect of Lattice Strain and Defects on the Superconductivity of $MgB_2$," Applied Physics Letters, vol. 79, No. 26, pp. 4399–4401, 2001.
Canfield, "Superconductivity in Dense $MgB_2$ Wires," Physical Review Letters, vol. 86, No. 11, pp. 2423–2426, 2001.
Larbalestier et al., "Strongly Linked Current Flow in Polycrystalline Forms of the Superconductor $MgB_2$," Nature, vol. 410, pp. 186–189, 2001.

* cited by examiner

Primary Examiner—Mark Kopec
Assistant Examiner—Kallambella M Vijayakumar
(74) Attorney, Agent, or Firm—Bruce H. Cottrell

(57) ABSTRACT

A process of preparing superconducting magnesium diboride powder by heating an admixture of solid magnesium and amorphous boron powder or pellet under an inert atmosphere in a Mg:B ratio of greater than about 0.6:1 at temperatures and for time sufficient to form said superconducting magnesium diboride. The process can further include exposure to residual oxygen at high synthesis temperatures followed by slow cooling. In the cooling process oxygen atoms dissolved into $MgB_2$ segregated to form nanometer-sized coherent Mg(B,O) precipitates in the $MgB_2$ matrix, which can act as flux pinning centers.

8 Claims, 6 Drawing Sheets

SYNTHESIS OF MAGNESIUM DIBORIDE BY MAGNESIUM VAPOR INFILTRATION PROCESS (MVIP)

STATEMENT REGARDING FEDERAL RIGHTS

This invention was made with government support under Contract No. W-7405-ENG-36 awarded by the U.S. Department of Energy. The government has certain rights in the invention.

FIELD OF THE INVENTION

The present invention relates to a process for synthesis of high quality superconducting magnesium diboride ($MgB_2$) powders.

BACKGROUND OF THE INVENTION

Recently, magnesium diboride ($MgB_2$) was found to exhibit superconducting properties. It is thought that $MgB_2$ may be an alternate to conventional superconductors such as NbTi or BSCCO in the 20–30K and 0–1T range for the fabrication of conductor tapes or wires. That has naturally lead to investigation into optimal processes for preparing this material. Prior processes for producing $MgB_2$ powders generally have described the use of stoichiometric amounts of magnesium and boron, i.e., Mg:B of 1:2 (e.g., Cunningham et al., Physica C, v. 353, pp. 5–10 (2001)), have heated such mixtures under vacuum or under a hydrogen/argon mix, have used quartz tubes, or have required high pressure techniques to obtain the desired $MgB_2$.

Other prior processes have included a process wherein boron filaments are exposed to magnesium vapor and processes involving deposition of magnesium diboride via magnetron sputtering, pulsed laser deposition and the like. Just recently, Aswal et al. (Physica C, v. 363(#3) pp. 149–154, Nov. 15, 2001) have described a process that involves Mg excess to avoid Mg loss during the synthesis. However, they mixed boron and magnesium powders and pressed the mixture into pellets and did not produce $MgB_2$ powder with good superconductive properties.

Despite these prior processes, an improved process for preparing magnesium diboride powder has been desired. After extensive and careful investigation, a process has now been found in the preparation of magnesium diboride powder. In particular, the present process involves heating amorphous boron powder pressed in pellets and solid magnesium under an inert atmosphere in a Mg:B ratio larger than about 0.6:1 at temperatures and for a time sufficient to form superconducting magnesium diboride. Note that the solid magnesium pieces (e.g. turnings or shavings) were not mixed with the boron powder in this invention. This leads to high quality $MgB_2$ superconducting powders since the impurities and MgO in the magnesium metal would not be left inside the $MgB_2$ powder after its synthesis.

It is an object of the present invention to provide a process of preparing high quality superconducting magnesium diboride.

It is another object of the present invention to provide stable superconducting magnesium diboride compositions.

It is another object of the present invention to provide a process, which allows the formation of Mg(B,O) precipitates inside $MgB_2$ grains that act as flux pinning centers in magnetic field.

SUMMARY OF THE INVENTION

To achieve the foregoing and other objects, and in accordance with the purposes of the present invention, as embodied and broadly described herein, the present invention provides a process of preparing superconducting magnesium diboride powder by heating amorphous boron powder and solid magnesium under an inert atmosphere in a Mg:B ratio greater than about 0.6:1 at temperatures and for time sufficient to form said superconducting magnesium diboride.

DETAILED DESCRIPTION

The present invention is concerned with preparation of magnesium diboride powder and with preparation of superconducting magnesium diboride powder that is stable under ambient environment (i.e., under humidity and $CO_2$).

In the present invention, the starting materials of magnesium and boron are reacted in a Mg:B ratio greater than about 0.6:1, more preferably greater than about 0.7:1, most preferably in a Mg:B ratio of about 1:1. While ratios outside this range may be used, the drawbacks are that samples made from Mg:B ratios with less than about 0.6:1 have insufficient magnesium for efficient reaction with the boron and generally have significantly wider superconducting transition widths and or lower Tc.

The starting materials are solid magnesium and solid amorphous boron. The boron is preferably powder with a high surface area. In one embodiment, the boron is a fine powder of about 325 mesh. The fine boron is preferably pressed into small pellets of from about 1 to 10 mm in diameter and about 4 mm in thickness without any binder. The solid magnesium can generally be of a larger form than the boron. For example, the magnesium can be in the form of shavings, turnings, lumps, rods, foils, wires and the like, generally of a size of less 1 centimeter in length.

In the preferred embodiment of the present invention, the magnesium and boron are wrapped in a tantalum (Ta) foil. Other metal foils such as molybdenum (Mo) and iron (Fe) or other metals that do not react with Mg at high temperatures may also be used in place of the tantalum.

The materials are heated under a flux or flowing stream of an inert gas such as argon, nitrogen and the like. In one embodiment of the present invention, while the gas stream is still described as inert, very minor trace amounts of oxygen can be present from the process of industrially processing the gas, e.g., minor amounts of oxygen can be present even within ultra-high purity argon.

In the process of the present invention, the magnesium and boron starting materials are heated to temperatures between about 800° C. and about 1000° C., preferably between 875° C. and 900° C., such temperature range also referred to as the synthesis temperature. After maintaining the starting materials at this temperature for a period of at least about half an hour, the sample can be slowly cooled (a rate about 0.5° C./min) from the synthesis temperature to about 300–500° C., preferably to from about 475° C. to about 525° C. Such a slow cooling process can lead to the presence of small precipitates adequate for flux pinning as described in example 3. The sample is then cooled to room temperature.

The present invention is more particularly described in the following examples, which are intended as illustrative only, since numerous modifications and variations will be apparent to those skilled in the art.

EXAMPLE 1

Figure 1:
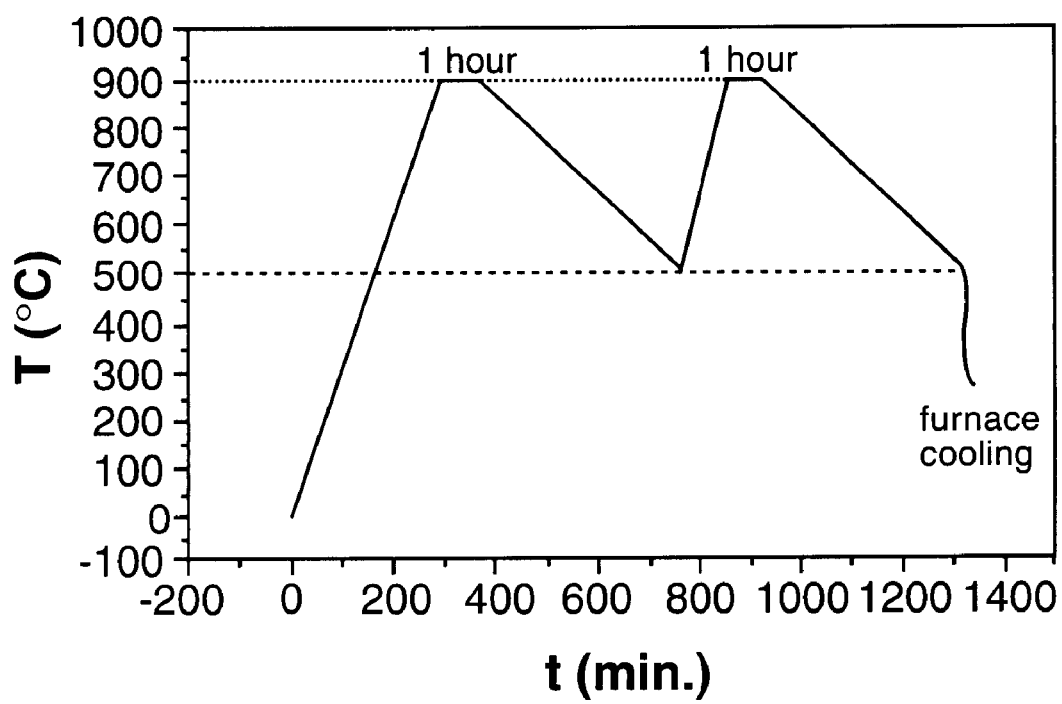
FIG. 1 shows an exemplary thermal cycle used in the synthesis of superconducting $MgB_2$ powder.

$MgB_2$ samples were prepared by solid-state reaction under flowing argon. Starting materials were amorphous boron powder (about 325 mesh, 99.99% from Alfa Aesar) and magnesium turnings (<1 cm, 99.98 %, from Puratronic) in a Mg:B ratio of 1:1. While not wishing to be bound by the present explanation, it is believed that the presence of excess magnesium aids in the formation of $MgB_2$ via a process of diffusion of magnesium vapor into the boron grains. Only the boron powder was pressed in small pellets (diameters of about 5 mm) and all materials were wrapped in tantalum foil and then placed into an alumina crucible inside a tube furnace under a flow of ultrahigh purity (UHP) argon. The furnace was previously sealed and subjected to vacuum prior to argon flow. In FIG. 1 is shown an example of the thermal cycle used. The samples were heated for one hour at 900° C. (a heating rate from ambient temperature at 3° C. per minute) and slowly cooled down to 500° C. (at a rate of 0.5° C. per minute). The sample was then re-heated for one hour to between 750° C. and 900° C. and then cooled in the furnace (furnace turned off) to room temperature.

The excess of magnesium is evaporated during the second heating cycle since the melting temperature of Mg is 600° C. and liquid Mg has a high vapor pressure. Samples were characterized by SEM and XRD. Powder X-ray diffraction data, collected using a Scintag XDS2000 θ—θ powder diffractometer, indicated that all samples were nearly single phase, with small amounts of MgO. The morphology of the samples was observed using a JEOL 6300FX scanning electron microscope (SEM). The magnetization properties were examined in a commercial SQUID magnetometer. The samples were nearly single phase with very small amounts of magnesium oxide (MgO) impurities as determined by XRD and exhibit sharp superconducting transitions with a Tc of 39 K in zero field cooling measurements. The MgO forms at grain boundaries and Mg(B,O) precipitates form inside the grain themselves. In neither case does the Mg(B,O) depress the Tc and these precipitates act as pinning centers in the grains (see example 3).

Figure 2:
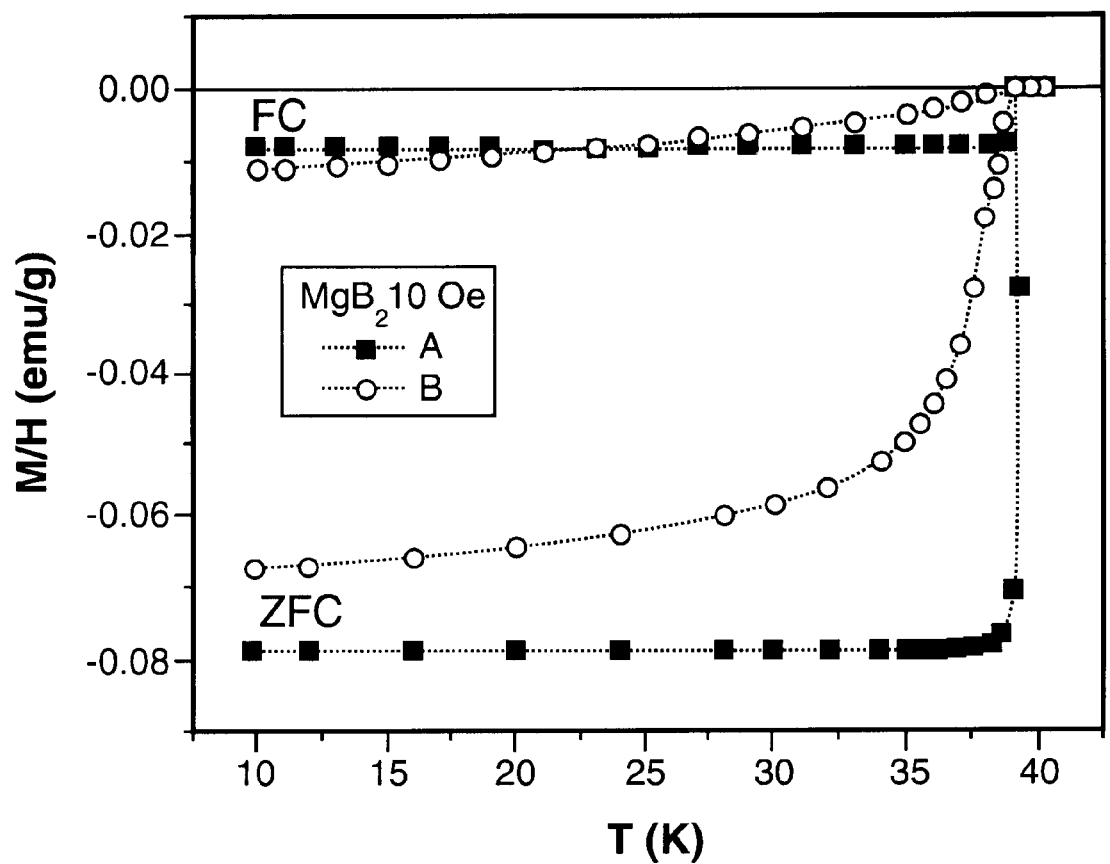
FIG. 2 shows a comparison of magnetization data divided by an applied field (10 Oe) for a powder prepared by the process of the present invention and a sample prepared by the process described by prior processes.
Figure 3:
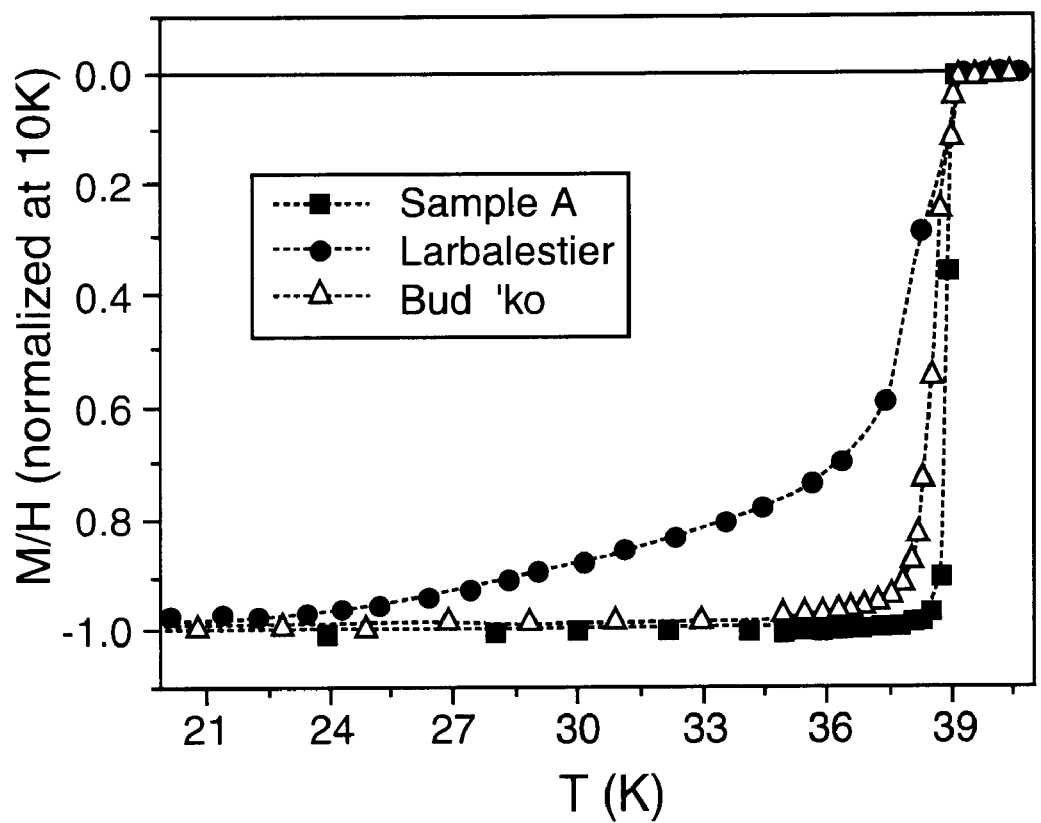
FIG. 3 shows a further comparison of magnetization data divided by an applied field (10 Oe) for a powder prepared by the process of the present invention and a sample prepared by the process described by prior processes.

In FIG. 2 is shown a comparison of magnetization data divided by an applied field (10 Oe) for the powder prepared by the process of Example 1 and a sample prepared by the process described by prior processes. In FIG. 3 is shown a further comparison of magnetization data divided by an applied field (10 Oe) for a powder prepared by the process of Example 1 and a sample prepared by the process of Bud'ko et al., Phys. Rev. Lett., vol. 86, pp. 1877–1880 (2001) and Larbalestier et al., Nature, v. 410, pp. 186–189 (2001). These results shown the improved properties obtained by the process of the present invention.

EXAMPLE 2

Four different samples were prepared by varying synthesis parameters (see Table 1). Amorphous boron powder and magnesium turnings as in Example 1 were used as starting materials for all samples. Sample A is the same as described in Example 1. Sample B was sealed in a quartz tube under argon atmosphere, heated at 900° C., slowly cooled down at 0.5° C./min to 600° C., and then fast cooled with water. For comparison, Sample C was prepared starting with a stoichiometric mixture, following the procedure of Bud'ko et al., Phys. Rev. Lett., vol. 86, pp.1877–1880 (2001), in which magnesium and boron were mixed in an atomic ratio of Mg:B=1:2 without pressing pellets. The mixture was sealed in a Ta tube under argon atmosphere, which was encapsulated in a quartz ampoule and heated for two hours at 950° C., and then cooled to room temperature. Sample A was ground into a powder, from which Sample D was prepared by hot isostatic pressing (HIPing) at 200 MPa as previously reported by Frederick et al., Physica C, vol. 363, 1 (2001) and others.

All samples were characterized as in Example 1. The susceptibility of the samples was measured using a superconducting quantum interference device (SQUID) magnetometer at 10 Oe. All as-synthesized samples have about the same Tc. However, their widths of superconducting transition and the grain sizes were quite different (see Table 1).

TABLE 1

Synthesis parameters, Tc, and grain size (observed by SEM) for $MgB_2$ samples.

| Sample | Synthesis parameters | Mg:B | Tc [K] | ΔTc (10–90%) [K] | Grain size [μm] |
|---|---|---|---|---|---|
| A | 900° C. 2 h Ar flux | 1:1 | 39.0 ± 0.2 | 0.4 | 0.5–5.0 |
| B | 900° C. 1 h Quartz tube | 1:1 | 38.8 ± 0.2 | 4.3 | 0.1–0.5 |
| C | 950° C. 2 h Quartz tube* | 1:2 | 38.9 ± 0.2 | 10.3 | 0.2–1.0 |
| D | Sample A HiPed at 200 MPa | 1:1 | 38.9 ± 0.2 | 0.5 | 0.3–3.0 |

*Mg turnings and B powder mixed

Figure 4:
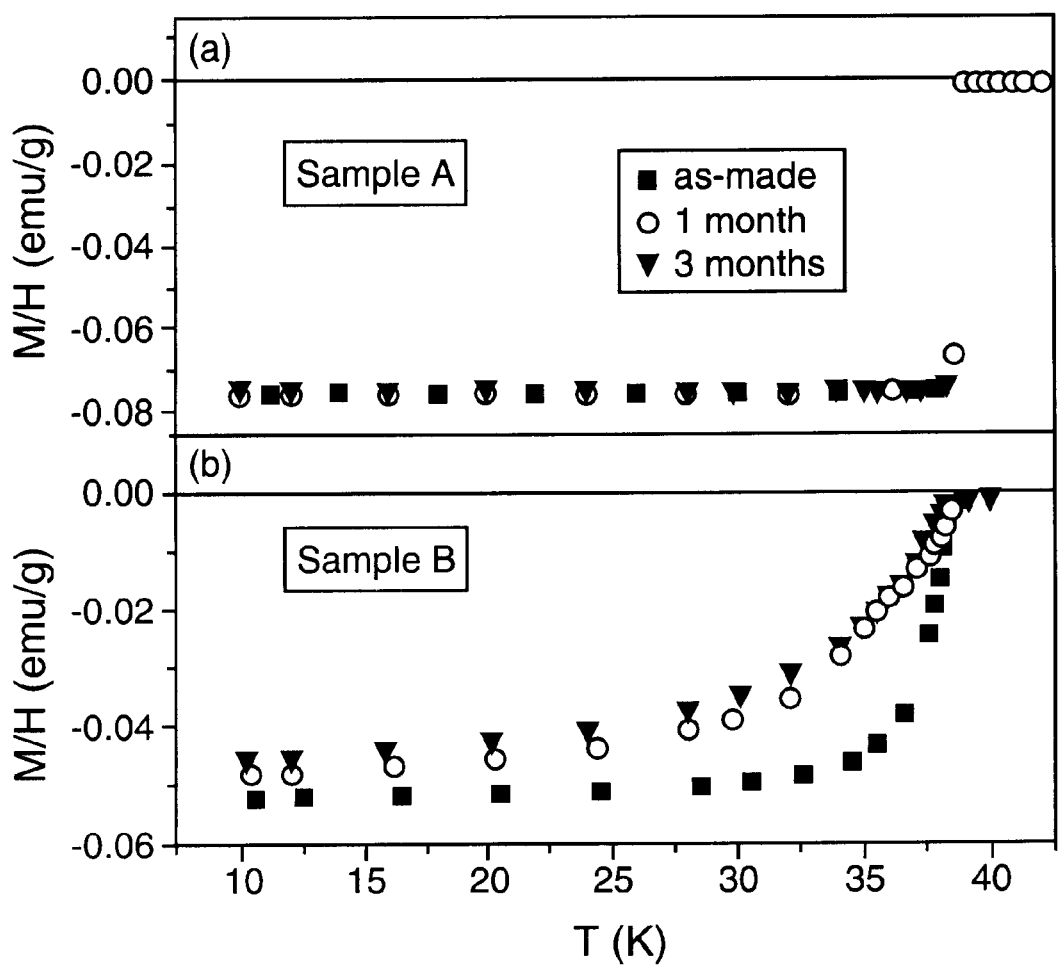
FIG. 4 shows magnetic susceptibility of two different $MgB_2$ samples (from Table 1) as a function of temperature for different aging times where a constant magnetic field of 10 Oe was applied.

To study the stability of the samples under ambient conditions, measurements were taken on the same four samples (A, B, C. and D) after exposing them to air for several periods of time. In FIG. 4 are plotted the dc magnetization vs. temperature for the $MgB_2$ samples A and B after preparation and after aging. It can be seen that sample A, which was prepared with excess magnesium and had larger grain sizes, remained stable for several months under ambient conditions. The same behavior is observed in sample D. In contrast, sample B underwent a slow degradation. Although the Tc did not change, the superconducting fraction at 10 K was reduced by about 13% and the superconducting transition itself became broader (ΔTc=15.3 K). The behavior of sample C was similar to sample B, with a reduction of the superconducting fraction by about 10 percent.

It is concluded that the degradation of some $MgB_2$ samples in air was caused by a surface decomposition as observed by X-ray Photoelectron Spectroscopy (XPS).

Upon air exposure, the surfaces and possibly also the interfaces oxidized, and more specifically in this case, hydroxylated, to form magnesium oxy-hydroxide. Samples with small grain sizes and not well-sintered are more susceptible to degradation when exposed to air. High-quality stable samples can be synthesized using the process of the present invention, which requires the presence of excess magnesium under argon flux.

EXAMPLE 3

Three different samples were prepared by varying synthesis parameters, especially the cooling rate. Amorphous boron powder and magnesium turnings as in Example 1 were used as starting materials for all samples. Sample A was processed the same as described in Example 1. Sample B was also placed in an alumina crucible inside a tube furnace under UHP Ar, heated at 900° C. for one hour and fast cooled to room temperature without exposure to air. Sample C was sealed in a quartz tube under UHP Ar atmosphere and placed into the furnace. This sample was heated for one hour at 900° C., slowly cooled down at 0.5° C./min to 600° C. and then removed and quenched in water.

The samples were investigated using transmission electron microscopy. Results suggest that oxygen dissolved in bulk $MgB_2$ at high synthesis temperatures when the $MgB_2$ samples were exposed to trace amount of oxygen from flowing ultra-high purity Ar gas. The lower solubility of oxygen in $MgB_2$ at lower temperature led to the precipitation of nanometer-sized coherent Mg(B,O) in the interior of $MgB_2$ grains during subsequent cooling. The precipitates, which act as effective flux pinning centers, are of composition-modulated structures with the same basic crystal lattice and orientation as the $MgB_2$ matrix. This suggests the potential of tailoring the size and distribution of Mg(B,O) precipitates through optimizing synthesis parameters for optimum flux pinning.

Figure 5:
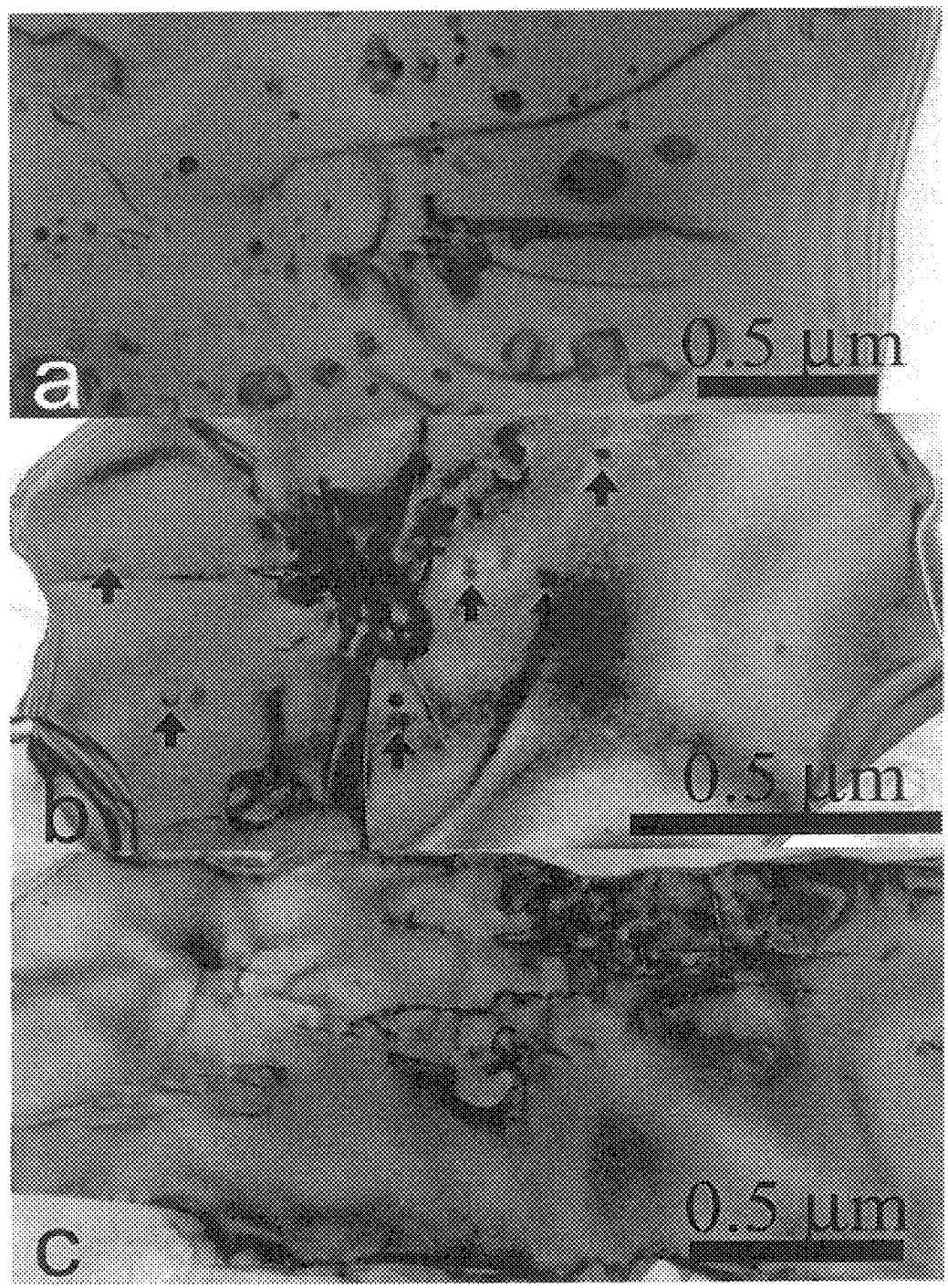
FIG. 5 shows computer generated digital representations of [010] zone-axis bright-field diffraction contrast images of a crystallite in three different $MgB_2$ samples (from example 3) (a) sample A, (b) sample B, and (c) sample C. Some precipitates in sample B are indicated by arrows.
Figure 6:
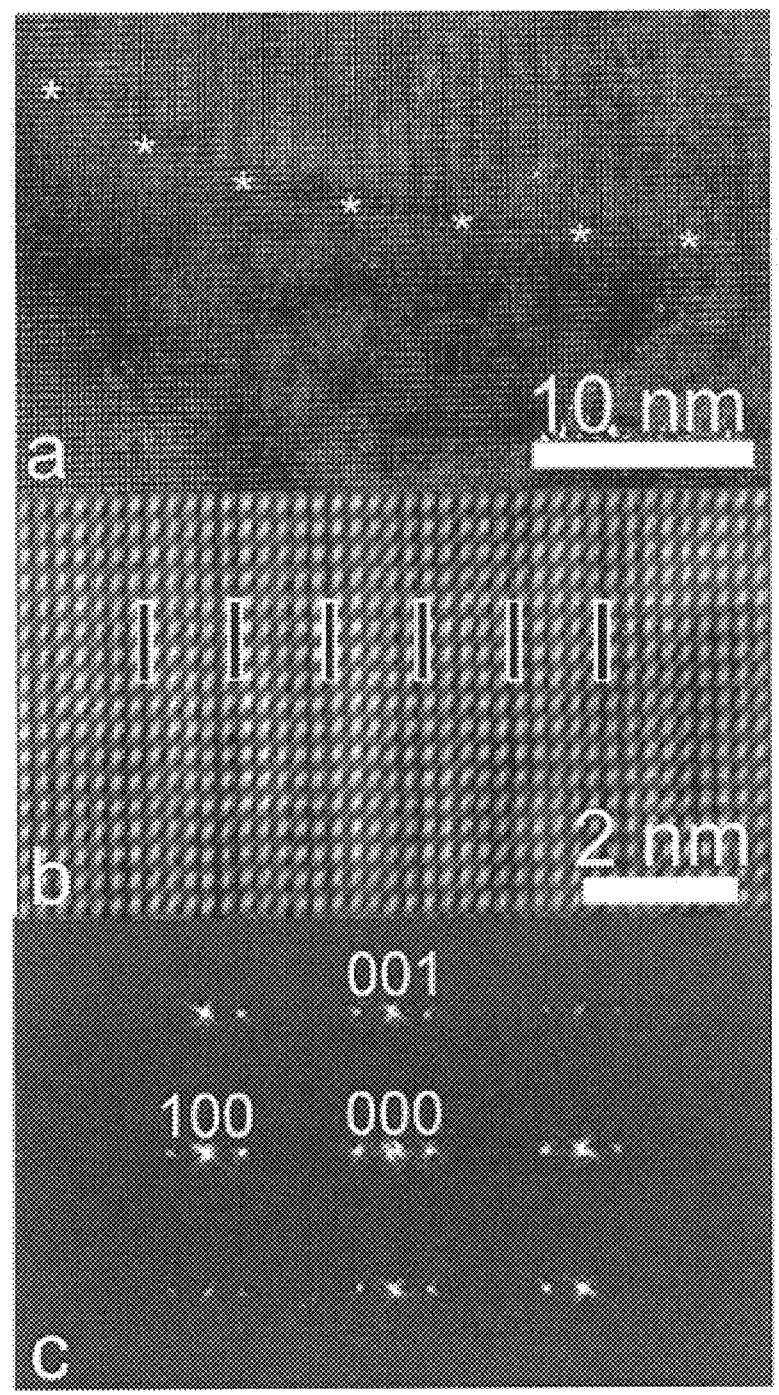
FIG. 6 shows computer generated digital representations of (a) a high-resolution TEM image showing the relationship between a precipitate and its surrounding $MgB_2$ matrix; and (b) a magnified high-resolution image of the precipitate shown in (a).

In FIG. 5 is shown [010] zone-axis bright-field diffraction contrast images of a crystallite in the three different $MgB_2$ samples (a) sample A, (b) sample B, and (c) sample C. Some precipitates in sample B are indicated by arrows. In FIG. 6 is shown (a) a high-resolution TEM image showing the relationship between a precipitate and its surrounding $MgB_2$ matrix; (b) a magnified high-resolution image of the precipitate shown in (a). The period of contrast change is marked with black bars; (c) Fourier-transformation of (b). The basic diffraction spots are indexed using three indexes system. Satellite diffraction spots are seen along [100]* with a period of 1/5[100]*.

Serquis et al., Appl. Phys. Lett., 79, pp. 4399–4401 (2001) further describes the subject matter of the present invention and is incorporated herein by reference in its entirety.

Although the present invention has been described with reference to specific details, it is not intended that such details should be regarded as limitations upon the scope of the invention, except as and to the extent that they are included in the accompanying claims.

What is claimed is:

1. A process of preparing superconducting magnesium diboride powder comprising:

heating amorphous boron powder and solid magnesium under inert atmosphere containing trace amounts of oxygen in a Mg:B ratio of greater than 0.6:1 to form said superconducting magnesium diboride:

and, slow controlled cooling of said superconducting magnesium diboride whereby said oxygen forms nanometer-sized coherent Mg(B,O) precipitates within said superconducting magnesium diboride, wherein the said precipitate is capable of acting as flux pinning centers.

2. The process of claim 1 wherein said heating is at temperatures of from about 800° C. to about 1000° C.

3. The process of claim 1 wherein said inert atmosphere is argon.

4. The process of claim 1 wherein said amorphous boron powder is of about 325 mesh.

5. The process of claim 1 wherein said solid magnesium is of the form of shavings, turnings, lumps, rods, foils or wires.

6. The process of claim 1 wherein said amorphous boron powder is of about 325 mesh, said solid magnesium is shavings or turnings and said amorphous boron powder and said solid magnesium is wrapped within a tantalum foil.

7. The process of claim 1 wherein the Mg:B ratio is about 1:1.

8. The process of claim (1) wherein the slow controlled cooling is to control the size and distribution of Mg (B,O) precipitate.

* * * * *